US012382778B2

(12) United States Patent
Qiu et al.

(10) Patent No.: US 12,382,778 B2
(45) Date of Patent: Aug. 5, 2025

(54) ORGANIC ELECTROLUMINESCENT DEVICE, DISPLAY PANEL AND DISPLAY APPARATUS (71) Applicant: BOE Technology Group Co., Ltd., Beijing (CN)

(72) Inventors: Lixia Qiu, Beijing (CN); Lei Chen, Beijing (CN); Congcong Jia, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 879 days.

(21) Appl. No.: 17/626,458

(22) PCT Filed: Apr. 8, 2021

(86) PCT No.: PCT/CN2021/086011
§ 371 (c)(1),
(2) Date: Jan. 11, 2022

(87) PCT Pub. No.: WO2021/227719
PCT Pub. Date: Nov. 18, 2021

(65) Prior Publication Data
US 2022/0302404 A1 Sep. 22, 2022

(30) Foreign Application Priority Data
May 14, 2020 (CN) .......................... 202010406375.3

(51) Int. Cl.
H10K 50/13 (2023.01)
H10K 50/11 (2023.01)
H10K 50/12 (2023.01)
H10K 71/00 (2023.01)
H10K 50/18 (2023.01)
H10K 59/10 (2023.01)
H10K 85/60 (2023.01)
H10K 101/30 (2023.01)
H10K 101/40 (2023.01)
H10K 102/00 (2023.01)

(52) U.S. Cl.
CPC ............ H10K 50/11 (2023.02); H10K 50/12 (2023.02); H10K 71/00 (2023.02); H10K 50/18 (2023.02); H10K 59/10 (2023.02); H10K 85/626 (2023.02); H10K 2101/30 (2023.02); H10K 2101/40 (2023.02); H10K 2102/351 (2023.02)

(58) Field of Classification Search
None
See application file for complete search history.

(56) References Cited
U.S. PATENT DOCUMENTS

| 4,769,292 A | 9/1988 | Tang et al. | |
| 6,475,648 B1* | 11/2002 | Hatwar | H01B 1/127 |
| | | | 313/506 |
| 2006/0158102 A1 | 7/2006 | Kawamura et al. | |
| 2008/0102310 A1* | 5/2008 | Thompson | H10K 50/125 |
| | | | 313/503 |
| 2011/0127510 A1 | 6/2011 | Seo et al. | |
| 2012/0126205 A1 | 5/2012 | Kawamura et al. | |
| 2013/0292656 A1 | 11/2013 | Seo et al. | |
| 2017/0125487 A1* | 5/2017 | Song | H10K 50/125 |
| 2018/0122870 A1* | 5/2018 | Park | H10K 50/131 |
| 2018/0323396 A1 | 11/2018 | Tsukamoto et al. | |
| 2019/0006590 A1 | 1/2019 | Park et al. | |
| 2019/0189947 A1 | 6/2019 | Shin et al. | |
| 2019/0288042 A1* | 9/2019 | Song | H10K 50/15 |
| 2020/0044175 A1 | 2/2020 | Kotake et al. | |
| 2020/0083471 A1* | 3/2020 | Adamovich | H10K 50/11 |
| 2021/0036065 A1* | 2/2021 | Adamovich | H10K 50/166 |
| 2021/0104692 A1* | 4/2021 | Kim | H10K 85/342 |
| 2021/0126214 A1 | 4/2021 | Miyashita et al. | |
| 2021/0202876 A1* | 7/2021 | Kim | H10K 50/11 |
| 2022/0085299 A1* | 3/2022 | Lee | H10K 85/6572 |

FOREIGN PATENT DOCUMENTS

| CN | 1346233 A | 4/2002 |
| CN | 1492724 A | 4/2004 |
| CN | 101069299 A | 11/2007 |
| CN | 102142525 A | 8/2011 |
| CN | 103378300 A | 10/2013 |
| CN | 104183721 A | 12/2014 |
| CN | 104183754 A | 12/2014 |
| CN | 108064258 A | 5/2018 |
| CN | 108352455 A | 7/2018 |
| CN | 109994637 A | 7/2019 |

(Continued)

OTHER PUBLICATIONS

Machine translation of CN-111081890-A, translation generated Jan. 2025, 7 pages. (Year: 2025).*
Yao, Jingwen, et al. "High efficiency and low efficiency roll-off all fluorescent white organic light-emitting diodes based on phosphor sensitization." Journal of Materials Chemistry C 8.5 (2020): 1666-1672. (Year: 2020).*

(Continued)

Primary Examiner — Robert S Loewe
(74) Attorney, Agent, or Firm — IPro, PLLC (57) ABSTRACT An organic electroluminescent device, a display panel, and a display apparatus. The organic electroluminescent device comprises: an anode (301) and a cathode (302) arranged opposite to each other, an organic electroluminescent layer (303) located between the anode (301) and the cathode (302), and an electron blocking layer (304) located between the anode (301) and the organic electroluminescent layer (303); the organic electroluminescent layer (303) comprises: a first sub luminescent layer (3031), and a second sub luminescent layer (3032) located between the cathode (302) and the first sub luminescent layer (3031). The first sub luminescent layer (3031) is composed of a luminescent host material (Host), a luminescent object material (Dopant), and a hole trapping material (Trap). The second sub luminescent layer (3032) is composed of the luminescent host material (Host) and the luminescent object material (Dopant).

17 Claims, 5 Drawing Sheets (56) References Cited

FOREIGN PATENT DOCUMENTS

| | | | | |
|---|---|---|---|---|
| CN | 110635061 A | | 12/2019 | |
| CN | 111081890 A | * | 4/2020 | ............ H01L 51/50 |
| CN | 111129334 A | | 5/2020 | |
| CN | 111554821 A | | 8/2020 | |
| JP | 2008294404 A | | 12/2008 | |
| JP | 2020013781 A | | 1/2020 | |
| JP | 2020021862 A | | 2/2020 | |

OTHER PUBLICATIONS

Fukagawa, H., et al. "Highly efficient, deep-blue phosphorescent organic light emitting diodes with a double-emitting layer structure." Applied Physics Letters 93.13 (2008). (Year: 2008).*
Duan, Lian, et al. "Controlling the recombination zone of white organic light-emitting diodes with extremely long lifetimes." Advanced Functional Materials 21.18 (2011): 3540-3545. (Year: 2011).*
CN202010406375.3 first office action.

* cited by examiner

ORGANIC ELECTROLUMINESCENT DEVICE, DISPLAY PANEL AND DISPLAY APPARATUS

CROSS-REFERENCE TO RELATED APPLICATIONS

The application is a National Stage of International Application No. PCT/CN2021/086011, filed on Apr. 8, 2021, which claims priority to the Chinese Patent Application No. 202010406375.3, filed to China Patent Office on May 14, 2020, and entitled "ORGANIC ELECTROLUMINESCENT DEVICE, DISPLAY PANEL AND DISPLAY APPARATUS", both of which are incorporated herein by reference.

FIELD

The present disclosure relates to the technical field of display, in particular to an organic electroluminescent device, a display panel and a display apparatus.

BACKGROUND

In recent years, an organic electroluminescence display, as a novel tablet display, has attracted increasing attention. Because of its characteristics of active light emitting, high luminance, high resolution ratio, wide viewing angle, fast response speed, low energy consumption and being capable of being flexible, the organic electroluminescence display has become a popular mainstream display product on the current market.

SUMMARY

An organic electroluminescent device provided by an embodiment of the present disclosure, includes: an anode and a cathode arranged opposite to each other, an organic electroluminescent layer between the anode and the cathode, and an electron blocking layer between the anode and the organic electroluminescent layer.

The organic electroluminescent layer includes: a first sub luminescent layer, and a second sub luminescent layer between the cathode and the first sub luminescent layer.

The first sub luminescent layer is composed of a luminescent host material, a luminescent object material and a hole trapping material, and the second sub luminescent layer is composed of a luminescent host material and a luminescent object material.

Optionally, in the above organic electroluminescent device provided by the embodiment of the present disclosure, a lowest unoccupied molecular orbital of the hole trapping material is higher than a lowest unoccupied molecular orbital of the luminescent host material and lower than a lowest unoccupied molecular orbital of the electron blocking layer.

Optionally, in the above organic electroluminescent device provided by the embodiment of the present disclosure, a highest occupied molecular orbital of the hole trapping material is higher than a highest occupied molecular orbital of the luminescent host material and lower than a highest occupied molecular orbital of the luminescent object material.

Optionally, in the above organic electroluminescent device provided by the embodiment of the present disclosure, a hole mobility of the hole trapping material is larger than a hole mobility of the luminescent host material.

Optionally, in the above organic electroluminescent device provided by the embodiment of the present disclosure, a thickness of the first sub luminescent layer is smaller than ½ of or equal to ½ of a thickness of the organic electroluminescent layer.

Optionally, in the above organic electroluminescent device provided by the embodiment of the present disclosure, the thickness of the first sub luminescent layer is 5 nm to 20 nm.

Optionally, in the above organic electroluminescent device provided by the embodiment of the present disclosure, in the first sub luminescent layer, a mass ratio of the hole trapping material to the luminescent host material is 3:7 to 7:3.

Optionally, in the above organic electroluminescent device provided by the embodiment of the present disclosure, the hole trapping material is selected from one or any combination of AND, ADNP, An-1 or An-2:

ADN

ADNP

An-1

An-2

Optionally, in the above organic electroluminescent device provided by the embodiment of the present disclosure, the luminescent host material is selected from one or any combination of 4,4'-bis(2,2-distyryl)-1,1'-biphenyl, 4,4', 4''-tris(carbazol-9-yl) triphenylamine, N,N'-dimethylquinacridone, or 3-methyltriphenylamine.

Optionally, in the above organic electroluminescent device provided by the embodiment of the present disclosure, the luminescent object material is selected from one of 4,4'-bis(9-ethyl-3-carbazole vinyl)-1,1'-biphenyl and/or an amino-substituted distyryl aryl material.

Optionally, in the above organic electroluminescent device provided by the embodiment of the present disclosure, a material of the electron blocking layer is selected from 4,4-bis(9-carbazole)biphenyl and/or 9,9'-biphenyl-6-(9-phenyl-9h-carbazol-3-yl)-9h,9' h-3,3'-bicarbazole.

Optionally, in the above organic electroluminescent device provided by the embodiment of the present disclosure, in the first sub luminescent layer and the second sub luminescent layer, a mass ratio of the luminescent host material to the luminescent object material is 100:1 to 100:10.

Optionally, in the above organic electroluminescent device provided by the embodiment of the present disclosure, the organic electroluminescent layer is a blue luminescent layer.

Based on the same inventive concept, an embodiment of the present disclosure provides a method for manufacturing an organic electroluminescent device, including: providing a base substrate with an anode; forming, by adopting a multi-source co-evaporation, a first sub luminescent layer composed of a hole trapping material, a luminescent host material and a luminescent object material on the anode; and forming a second sub luminescent layer composed of the luminescent host material and the luminescent object material on the first sub luminescent layer, wherein the first sub luminescent layer and the second sub luminescent layer constitute an organic electroluminescent layer; and forming a cathode on the second sub luminescent layer.

Based on the same inventive concept, an embodiment of the present disclosure provides a display panel, including: a plurality of pixel units. At least part of the pixel units include the above organic electroluminescent device.

Based on the same inventive concept, an embodiment of the present disclosure provides a display apparatus, including: the above display panel.

DETAILED DESCRIPTION OF THE EMBODIMENTS

In order to make the objectives, technical solutions, and advantages of embodiments of the present disclosure clearer, the technical solutions of the embodiments of the present disclosure will be described clearly and completely in conjunction with the accompanying drawings of the embodiments of the present disclosure. Shapes and sizes of components in the drawings do not reflect the true proportions, and are only intended to illustrate the present disclosure. Obviously, the described embodiments are part of the embodiments of the present disclosure, rather than all of the embodiments. Based on the described embodiments of the present disclosure, all other embodiments obtained by those of ordinary skill in the art without creative labor are within the protection scope of the present disclosure.

Unless otherwise defined, the technical terms or scientific terms used in the present disclosure shall have the usual meanings understood by those of ordinary skill in the art to which the present disclosure belongs. "First", "second" and similar words used in the present disclosure and claims do not indicate any order, quantity or importance, but are only configured to distinguish different components. "Include" or "comprise" and other similar words mean that the element or item appearing before the word encompasses the element or item listed after the word and its equivalents, but does not exclude other elements or items. "Upper", "lower", "left", "right", etc. are only configured to indicate the relative positional relationship. When the absolute position of the described object changes, the relative positional relationship may also change accordingly.

With continuous development of organic electroluminescence display products, customers raise increasingly high requirements for resolution ratios of the organic electroluminescence display products, and meanwhile, development of AR/VR products require very high resolution ratios. The increase in resolution ratios and the reduction in aperture ratios increase the brightness requirements of an organic electroluminescent device in a red, green and blue (RGB) independent sub-pixel structure, which leads to greater tests and requirements for the life of the organic electroluminescent device. The decay of the life of the organic electroluminescent device causes white balance color of a panel product to drift after long-term use, and visually, the color will become red or green and pink when a white picture is on.

The decay of the life of the organic electroluminescent device is ultimately divided into aging of an interface and deterioration of a material caused by defects of the material.

Aging of the interface is mainly caused by an excessively large energy barrier at the interface and accumulation of excessive charge. In the organic electroluminescent device (especially a blue organic electroluminescent device) in the related art, a luminescent host material (Host) needs a broadband system, so its highest occupied molecular orbital (HOMO) energy level is very deep, resulting in a larger difference in energy levels between a hole-type electron blocking layer (EBL or Prime) and the luminescent host material, namely larger than 0.3 eV. Existence of the energy barrier leads to accumulation of excessive holes, which further results in that the interface is prone to aging, so decay of life of the device is excessively fast.

Figure 1:
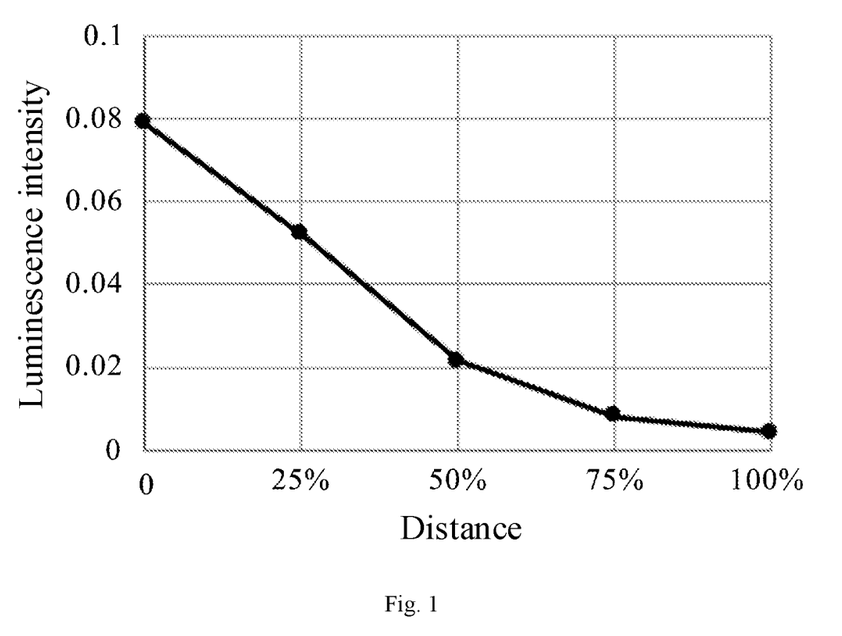
FIG. 1 is a distribution diagram of exciton recombination regions in an electroluminescent layer in the related art.
Figure 2:
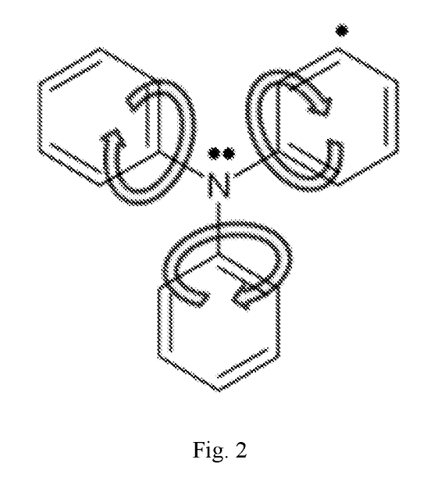
FIG. 2 is a schematic diagram of bond twisting in the related art.

A material that is most easily degraded in the organic electroluminescent device is a material of the electron blocking layer, because exciton recombination regions in an organic electroluminescent layer are mainly concentrated on a 0% of an interface of the electron blocking layer and the organic electroluminescent layer (EML), resulting in accumulation of excessive electrons at the interface, as shown in FIG. 1. The material of the electron blocking layer is generally an electron-rich system material containing an aniline structure, and the accumulated electrons generate an action of repulsive force with rich electrons of the electron blocking layer itself. This kind of repulsive force will cause a δ bond of a benzene ring on the aniline to be twisted, and a result of the δ bond twisting caused by external force is the cleavage of the bond, as shown in FIG. 2. Defects generated by bond cleavage are roots of decayed life of the material and the device. The exciton recombination regions are mainly decided by transmission performance of the luminescent host material itself, and can hardly be changed through adjustment on other functional layers.

Figure 3:
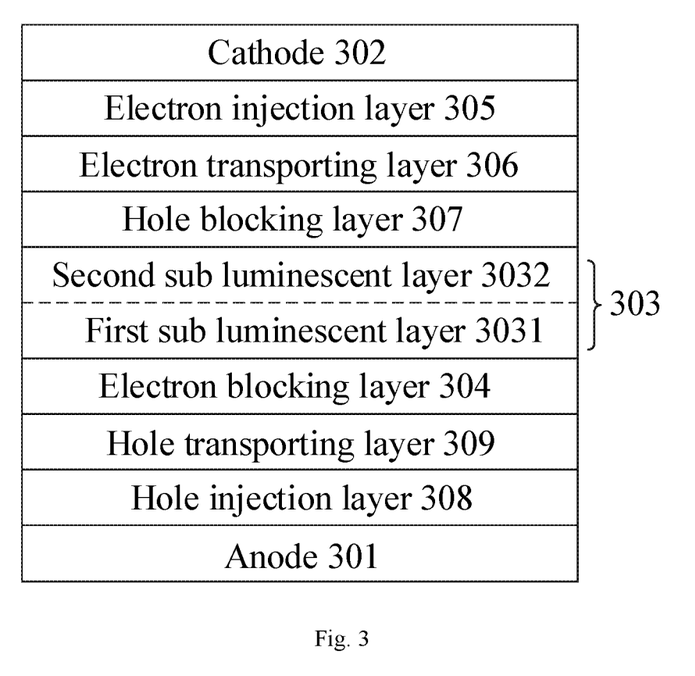
FIG. 3 is a schematic structural diagram of an organic electroluminescent device provided by an embodiment of the present disclosure.

Based on the above problems in the related art, an embodiment of the present disclosure provides an organic electroluminescent device, as shown in FIG. 3, including: an anode 301 and a cathode 302 arranged opposite to each other, an organic electroluminescent layer 303 located between the anode 301 and the cathode 302, and an electron blocking layer 304 located between the anode 301 and the organic electroluminescent layer 303.

The organic electroluminescent layer 303 includes: a first sub luminescent layer 3031, and a second sub luminescent layer 3032 located between the cathode 302 and the first sub luminescent layer 3031.

The first sub luminescent layer 3031 is composed of a luminescent host material (Host), a luminescent object material (Dopant) and a hole trapping material (Trap), and the second sub luminescent layer is composed of a luminescent host material and a luminescent object material.

In the above organic electroluminescent device provided by the embodiment of the present disclosure, by doping the hole trapping material carrying a hole trap effect in the first sub luminescent layer 3031, close to the electron blocking layer 304, in the organic electroluminescent layer 303 which determines transmission condition of carriers, on the one hand, holes at an interface of the electron blocking layer 304 and the organic electroluminescent layer 303 are timely trapped, so hole accumulation at the interface is reduced, and on the other hand, the holes are more easily transmitted into the organic electroluminescent layer 303, hole intensity inside the organic electroluminescent layer 303 is increased, exciton recombination regions are away from the interface of the electron blocking layer 304 and the organic electroluminescent layer 303, and transmission of excessive electrons to the electron blocking layer 304 is avoided, so stability of the interface and the materials is improved, and life of the device is extended.

Figure 4:
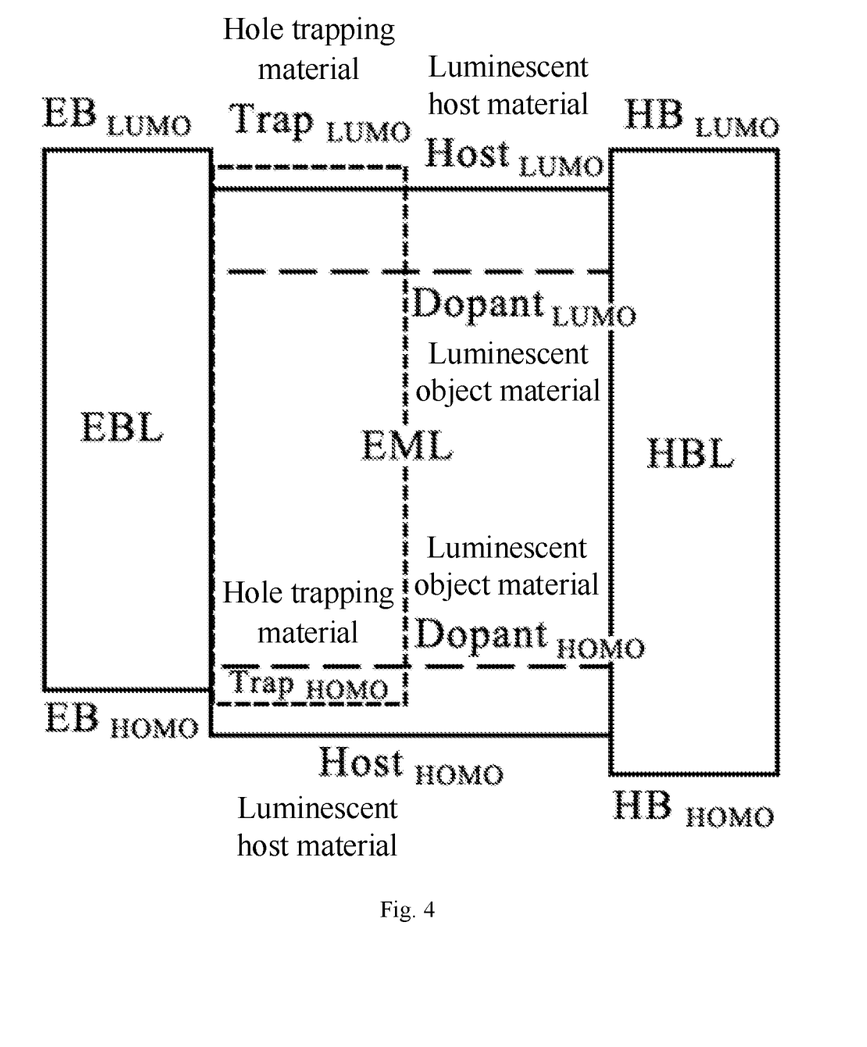
FIG. 4 is a schematic diagram of energy level relations of an organic electroluminescent device provided by an embodiment of the present disclosure.

Optionally, in the above organic electroluminescent device provided by the present disclosure, as shown in FIG. 4, a lowest unoccupied molecular orbital (LUMO) of the hole trapping material ($Trap_{LUMO}$) is higher than a lowest unoccupied molecular orbital of the luminescent host material ($Host_{LUMO}$) and lower than a lowest unoccupied molecular orbital of the electron blocking layer 304 ($EB_{LUMO}$). The LUMO energy level relation does not hinder transmission of the electrons on the luminescent host material, namely, avoid trapping for the electrons by the luminescent host material, and does not hinder an electron blocking effect of the electron blocking layer 304. Preferably, a difference between the lowest unoccupied molecular orbital of the hole trapping material ($Trap_{LUMO}$) and the lowest unoccupied molecular orbital of the luminescent host material ($Host_{LUMO}$) is larger than 0 eV, and a difference between the lowest unoccupied molecular orbital of the electron blocking layer 304 ($EB_{LUMO}$) and the lowest unoccupied molecular orbital of the luminescent host material ($Host_{LUMO}$) is larger than 0.1 eV.

Optionally, in the above organic electroluminescent device provided by the present disclosure, as shown in FIG. 4, a highest occupied molecular orbital of the hole trapping material ($Trap_{HOMO}$) is higher than a highest occupied molecular orbital of the luminescent host material ($Host_{HOMO}$) and lower than a highest occupied molecular orbital of the luminescent object material ($Dopant_{HOMO}$). The above HOMO energy level relation is conducive to trapping for the holes by the hole trapping material. Preferably, a difference between the highest occupied molecular orbital of the hole trapping material ($Trap_{HOMO}$) and the highest occupied molecular orbital of the luminescent host material ($Host_{HOMO}$) is larger than 0 eV, and a difference between the highest occupied molecular orbital of the luminescent object material ($Dopant_{HOMO}$) and the highest occupied molecular orbital of the luminescent host material ($Host_{HOMO}$) is larger than 0 eV and smaller than 0.2 eV.

Optionally, in the above organic electroluminescent device provided by the present disclosure, a hole mobility of the hole trapping material is larger than a hole mobility of the luminescent host material, so as to achieve trapping for the holes by the hole trapping material. Hole trapping may be achieved when a difference between the hole mobility of the hole trapping material and the hole mobility of the luminescent host material is larger than 0.

Exemplarily, in the above organic electroluminescent device provided by the embodiment of the present disclosure, the hole trapping material is selected from AND, ADNP, An-1, An-2 and other anthracenes materials. Corresponding structural formulas are as follows:

ADN

-continued

ADNP

An-1

An-2

The luminescent host material is selected from 4,4'-bis(2,2-distyryl)-1,1'-biphenyl, 4,4',4"-tris(carbazol-9-yl) triphenylamine, N,N'-dimethylquinacridone, 3-methyltriphenylamine, and other arylamine, carbazole and triazine materials. The luminescent object material is selected from 4,4'-bis(9-ethyl-3-carbazole vinyl)-1,1'-biphenyl, an amino-substituted distyryl aryl material, and other diphenylethene and pyrene materials. A material of the electron blocking layer is selected from 4,4-bis(9-carbazole)biphenyl, 9,9'-biphenyl-6-(9-phenyl-9h-carbazol-3-yl)-9h,9'h-3,3'-bicarbazole and other arylamine and carbazole materials.

Of course, the hole trapping material, the luminescent host material, the luminescent object material and material of the electron blocking layer may further be other materials known by those of skill in the art meeting the above energy level relations and mobility ratios, which are not specifically limited herein.

Optionally, in the above organic electroluminescent device provided by the present disclosure, a thickness of the first sub luminescent layer 3031 is smaller than ½ of or equal to ½ of a thickness of the organic electroluminescent layer 303. Because, as shown in FIG. 1, when the thickness is not larger than 50%, an exciton luminescence rate is over 80%. Therefore, by introducing the hole trapping material with hole trap structures within this thickness range, the holes at the interface of the electron blocking layer 304 and the organic electroluminescent layer 303 may be trapped more efficiently, the holes are more easily transmitted to the inside of the organic electroluminescent layer 303, distribution of the exciton recombination regions is thereby changed, and the exciton recombination regions are away from the interface of the electron blocking layer 304 and the organic electroluminescent layer 303.

Optionally, in the above organic electroluminescent device provided by the present disclosure, the thickness of the first sub luminescent layer is 5 nm to 20 nm, which means that the thickness of the organic electroluminescent layer 303 is 10 nm to 40 nm. In general, a thickness of an organic electroluminescent layer in the related art is 10 nm to 40 nm, and by setting the thickness of the organic electroluminescent layer 303 in the present disclosure to be equal to that in the related art, it may be guaranteed that performance of the exciton recombination regions in the present disclosure is similar to performance of exciton recombination regions in the related art, and therefore it may be guaranteed that chromaticity coordinates of light emitted by the device are not changed, so no color shift occurs when it is matched with other colors.

Optionally, in the above organic electroluminescent device provided by the present disclosure, in the first sub luminescent layer 3031, a mass ratio of the hole trapping material to the luminescent host material is 3:7 to 7:3, for example, 3:7, 3:6, 3:5, 3:4, 3:3, 4:3, 5:3, 6:3, 7:3, etc. The hole trapping material and the luminescent host material satisfying the above mass ratio may better trap the holes at the interface of the electron blocking layer 304 and the organic electroluminescent layer 303 and transmit the holes into the organic electroluminescent layer 303, so that recombination with the electrons inside the organic electroluminescent layer 303 is achieved to generate the excitons and the exciton recombination regions are away from the interface of the electron blocking layer 304 and the organic electroluminescent layer 303.

Optionally, in the above organic electroluminescent device provided by the present disclosure, in the first sub luminescent layer 3031 and the second sub luminescent layer 3032, a mass ratio of the luminescent host material to the luminescent object material is 100:1 to 100:10. On the one hand, the luminescent host material at the mass ratio may effectively transfer energy of the excitons to the luminescent object material to excite the luminescent object material to emit light, and on the other hand, the luminescent object material dilutes the luminescent object material, which effectively improves fluorescence quenching caused by collision between molecules of the luminescent object material and collision between the energy, and improves the luminescence efficiency and life of the device.

Optionally, in the above organic electroluminescent device provided by the present disclosure, the organic electroluminescent layer 303 is a blue luminescent layer. Because interface and material degradation of an organic electroluminescent device in the related art is relatively high, preferably, a blue organic electroluminescent device containing the blue luminescent layer adopts a structure of the present disclosure, which may better improve overall performance of a panel product.

Optionally, in the above organic electroluminescent device provided by the present disclosure, as shown in FIG. 3, the organic electroluminescent device may generally further include: an electron injection layer 305, an electron transporting layer 306 and a hole blocking layer 307 located between the cathode 302 and the second sub luminescent layer 3032, as well as a hole injection layer 308 and a hole transporting layer 309 located between the anode 303 and the electron blocking layer 304.

Based on the same inventive concept, an embodiment of the present disclosure provides a method for manufacturing an organic electroluminescent device. Because a problem solving principle of the method is similar to a problem solving principle of the above organic electroluminescent device, for implementation of the method provided by the embodiment of the present disclosure, reference may be made to implementation of the above organic electroluminescent device provided by the embodiment of the present disclosure, and repetition is not made here.

In particular, the method for manufacturing the organic electroluminescent device provided by the embodiment of the present disclosure may specifically include the following steps.

A base substrate with an anode is provided.

By adopting a multi-source co-evaporation, a first sub luminescent layer composed of a hole trapping material, a luminescent host material and a luminescent object material is formed on the anode; and a second sub luminescent layer composed of the luminescent host material and the luminescent object material is formed on the first sub luminescent layer, and the first sub luminescent layer and the second sub luminescent layer constituting an organic electroluminescent layer. A cathode is formed on the second sub luminescent layer.

In particular, because mass ratios of the luminescent host material to the luminescent object material in the first sub luminescent layer and the second sub luminescent layer are equal, mass ratios of the hole trapping material, the luminescent host material and the luminescent object material in the first sub luminescent layer may be controlled by setting evaporation rates of the hole trapping material, the luminescent host material and the luminescent object material. After a thickness of the first sub luminescent layer of the three co-doped is reached, a source of the hole trapping material may be closed, and the evaporation rates of the luminescent host material and the luminescent object material are continuously maintained, so co-evaporation of the two materials of the luminescent host material and the luminescent object material is achieved until a target thickness of the second sub luminescent layer is reached. In this way, manufacturing for an electroluminescent layer is completed.

In addition, the present disclosure further manufactures a device of a structure shown in FIG. 3, and corresponding symbols are represented as follows: ITO/HIL/HTL/EBL/host:trap:dopant/host:dopant/HBL/ETL/EIL/Mg:Ag. Correspondence relations between the symbols and different film layers are specifically as follows: indium tin oxide (ITO) layer represents an anode 301; HIL represents a hole injection layer 308 with a thickness of 5 nm to 30 nm; HTL represents a hole transporting layer 309 with a thickness of 1000 nm to 1300 nm; EBL represents an electron blocking layer 304 with a thickness of 10 nm to 80 nm; a thickness of an organic electroluminescent layer 303 is 10 nm to 40 nm, especially including a first sub luminescent layer 3031 represented by host:trap:dopant with a thickness of 5 nm to 20 nm, and a first sub luminescent layer 3032 represented by host:dopant, a sum of thicknesses of the first sub luminescent layer 3031 and the first sub luminescent layer 3032 being 10 nm to 40 nm; HBL represents a hole blocking layer 307 with a thickness of 5 nm to 10 nm; ETL represents an electron transporting layer 306 with a thickness of 20 nm to 35 nm; EIL represents an electron injection layer 305 with a thickness of 1 nm to 3 nm; and magnesium-silver (Mg—Ag) alloy represents a cathode 302.

It should be noted that although thickness ranges of all the above layers are given, the thickness may fluctuate within the ranges due to difference of light emitting colors of the device. In addition, materials of the film layers include but are not limited to the following possible types.

The hole injection layer 308 (HIL): molybdenum trioxide ($MoO_3$), 2,3,5,6-tetrafluoro-7,7',8,8'-tetracyanodimethyl-p-benzoquinone (F4-TCNQ), 2,3,6,7,10,11-hexacyano-1,4,5,8,9,12-hexaazatriphenylene (HAT-CN), etc.

The hole transporting layer 309 (HTL): arylamine materials, such as N,N'-diphenyl-N,N'-(1-naphthyl)-1,1'-biphenyl-4,4'-diamine (NPB), 4,4',4'-Tris(N-3-methylphenyl-N-phenylamino)triphenylamine (m-MTDATA), N,N'-diphenyl-N,N'-bis(3-methylphenyl)-1,1'-biphenyl-4,4'-diamine (TPD), etc.

The electron blocking layer 304 (EBL): arylamine or carbazole compound, such as 4,4-bis(9-carbazole)biphenyl (CBP), 9,9'-biphenyl-6-(9-Phenyl-9h-carbazol-3-yl)-9h,9'h-3,'-bicarbazole (Tris-PCz), etc.

The luminescent host material (Host): arylamine, carbazole or triazine materials, such as 4,4'-bis(2,2-distyryl)-1,1'-biphenyl (DPVBi), 4,4',4"-tris(carbazol-9-yl) triphenylamine (TCTA), N,N'-dimethylquinacridone (DMQA), 3-methyltriphenylamine (TmTPA), etc.

The hole trapping material (Trap): anthracene materials, such as 9,10-di-β-naphthylanthracene (AND), 9,10-di-α-naphthylanthracene (ADNP), 2-tert-butyl-9,10-bis(3,5-diphenyl phenyl)anthracene (An-1), 2-tert-butyl-9,10-bis(3,5-diphenylbiphenyl)anthracene (An-2), etc.

The luminescent object material (Dopant): diphenylethene and pyrene materials, such as 4,4'-bis(9-ethyl-3-carbazole vinyl)-1,1'-biphenyl (BCzVBi) and/or an amino-substituted distyryl aryl material (DSA-amine), etc.

The hole blocking layer 307 (HBL) and the electron transporting layer 306 (ETL): nitrogenous heteroaromatic ring materials, such as 2,9-dimethyl-4,7-biphenyl-1,10-phenanthroline (BCP), 4,7-diphenyl-1,10-phenanthroline (Bphen), 1,3,5-tris(1-phenyl-1H-benzimidazol-2-yl)benzene (TPBI), etc.

The electron injection layer 305 (EIL): lithium fluoride (LiF), ytterbium (Yb), lithium 8-quinolinolate (LIQ), etc.

In particular, the present disclosure prepares two devices, respectively a reference device R of the same structure as the organic electroluminescent device in the related art, and the device T of the present disclosure of the same structure as the organic electroluminescent device provided by the embodiment of the present disclosure. Specific structures of them are as follows.

The reference device R:
ITO/$MoO_3$/NPB/tris-PCz/DPVBi:BCzVBi/BCP/Bephen:LIQ/LIQ/Mg:Ag.

The device T of the present disclosure:
ITO/$MoO_3$/NPB/tris-PCz/DPVBi:AND:BCzVBi/DPVBi:BCzVBi/BCP/Bephen:LIQ/LIQ/Mg:Ag.

Figure 5:
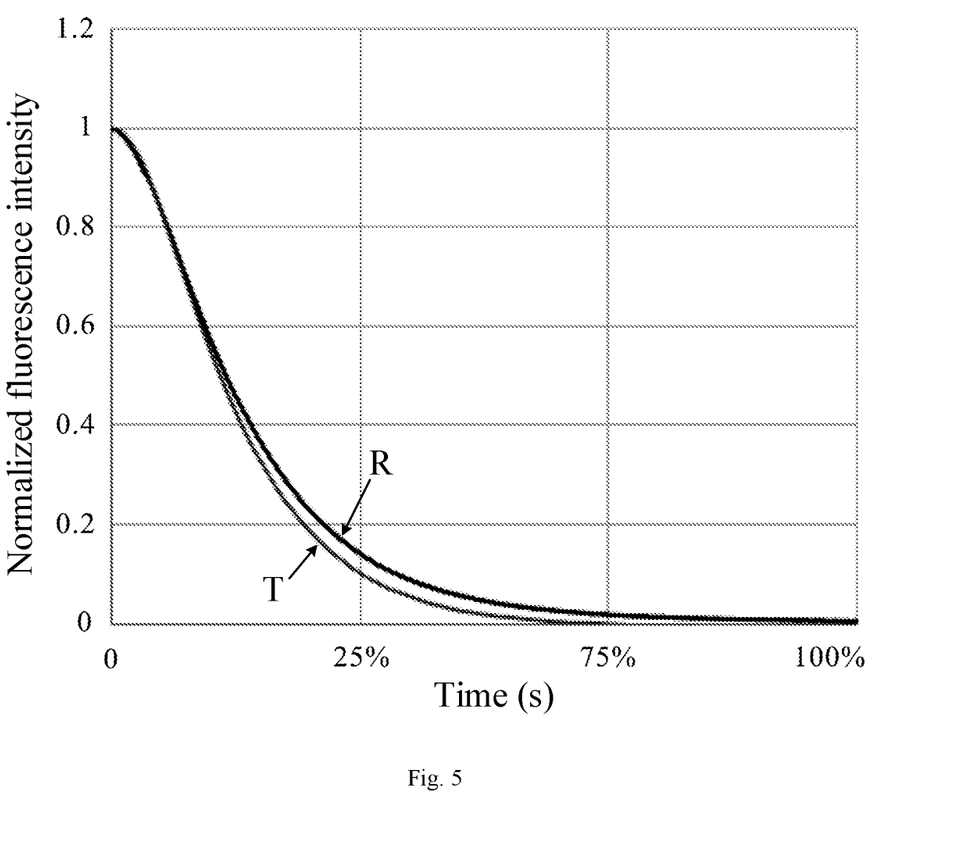
FIG. 5 is a diagram of transient electroluminescence of an organic electroluminescent device provided by an embodiment of the present disclosure.
Figure 6:
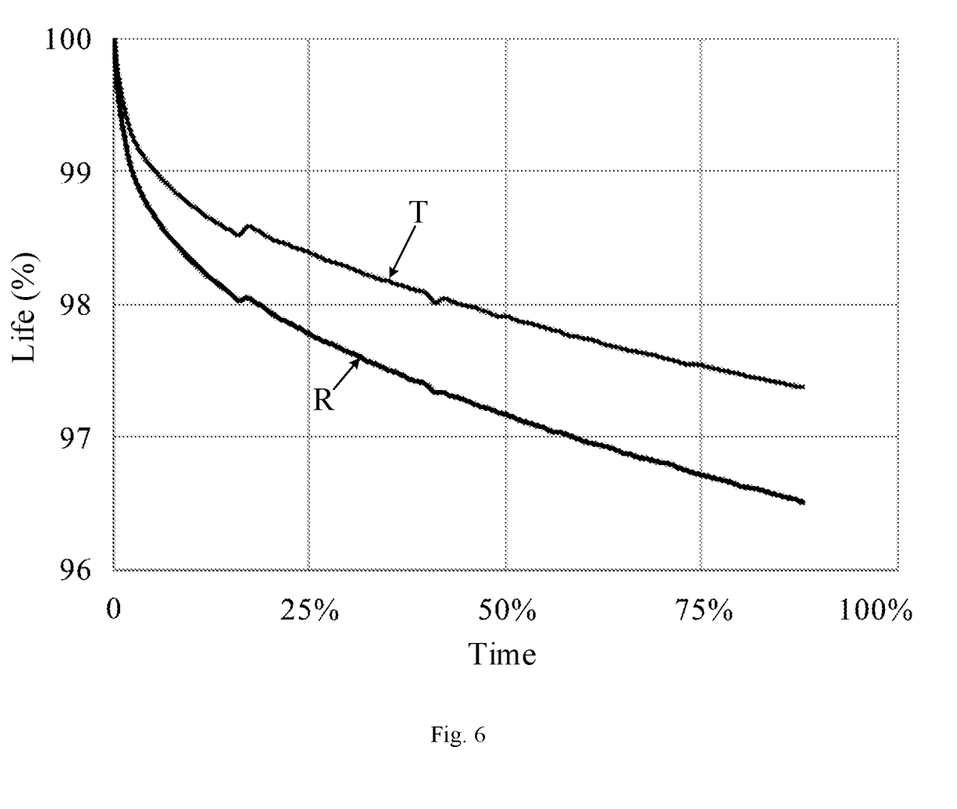
FIG. 6 is a life curve of an organic electroluminescent device provided by an embodiment of the present disclosure.

FIG. 5 is results of transient electroluminescence of the above two devices. In particular, square wave periodic signals with a certain pulse width are given to the organic electroluminescent devices to enable the organic electroluminescent devices to emit light in equilibrium, and then the square wave periodic signals are cancelled. FIG. 5 shows a relation between luminescence intensity decay and time after the square wave periodic signals are cancelled. It can be seen from FIG. 5 that the device T of the present disclosure with the hole trapping material added has a faster decay immediately after the square wave periodic signals are cancelled. Specifically, the decay time is about 75% of that of the reference device R. This proves that there are fewer unrecombined carriers in the device T of the present disclosure than in the reference device R, and fewer charges are accumulated in the device T of the present disclosure. In addition, life test results of the two devices shown in FIG. 6 show that the life of the device T of the present disclosure is better than that of the reference device R.

Based on the same inventive concept, an embodiment of the present disclosure further provides a display panel, including: a plurality of pixel units, and at least part of the pixel units include the above organic electroluminescent device. A problem solving principle of the display panel is similar to a problem solving principle of the above organic electroluminescent device, so for implementation of the display panel, reference may be made to the embodiment of the above organic electroluminescent device, and repetition is not made here.

It can be understood that the blue organic electroluminescent device has a serious life decay in the related art, so it is preferable to use the blue organic electroluminescent device in the display panel with the structure of the present disclosure to achieve a better white balance effect.

Based on the same inventive concept, an embodiment of the present disclosure further provides a display apparatus, including the above display panel provided by the embodiment of the present disclosure. The display apparatus may be: any product or component with a display function, such as a mobile phone, a tablet computer, a television, a monitor, a notebook computer, a digital photo frame, a navigator, a smart watch, a fitness wristband and a personal digital assistant. Other indispensable components of the display device should be understood by those of ordinary skill in the art, and will not be repeated here, nor should it be used as a limitation to the present disclosure. In addition, a problem solving principle of the display apparatus is similar to a problem solving principle of the above display panel, so for implementation of the display apparatus, reference may be made to the embodiment of the display panel, and repetition is not made here.

The above organic electroluminescent device, display panel and display apparatus provided by the embodiments of the present disclosure include: the anode and the cathode arranged opposite to each other, the organic electroluminescent layer located between the anode and the cathode, and the electron blocking layer located between the anode and the organic electroluminescent layer. The organic electroluminescent layer includes: the first sub luminescent layer, and the second sub luminescent layer located between the cathode and the first sub luminescent layer. The first sub luminescent layer is composed of the luminescent host material, the luminescent object material and the hole trapping material, and the second sub luminescent layer is composed of the luminescent host material and the luminescent object material. By doping the hole trapping material carrying the hole trap effect in the first sub luminescent layer close to the electron blocking layer in the organic electroluminescent layer which determines transmission condition of the carriers, on the one hand, the holes at the interface of the electron blocking layer and the organic electroluminescent layer are timely trapped, so hole accumulation at the interface is reduced, and on the other hand, the holes are more easily transmitted into the organic electroluminescent layer, the hole intensity inside the organic electroluminescent layer is increased, the exciton recombination regions are away from the interface of the electron blocking layer and the organic electroluminescent layer, and transmission of the excessive electrons to the electron blocking layer is avoided, so stability of the interface and the materials is improved, and life of the device is extended.

Obviously, those of skill in the art can make various changes and modifications to the present disclosure without departing from the spirit and scope of the present disclosure. In this way, if these variations and modifications of the present disclosure fall within the scope of the claims of the present disclosure and equivalent technologies, the present disclosure also intends to include these modifications and variations.

What is claimed is:

1. An organic electroluminescent device, comprising: an anode and a cathode arranged opposite to each other, an organic electroluminescent layer between the anode and the cathode, and an electron blocking layer between the anode and the organic electroluminescent layer; wherein
the organic electroluminescent layer comprises: a first sub luminescent layer, and a second sub luminescent layer between the cathode and the first sub luminescent layer; and
the first sub luminescent layer is composed of a luminescent host material, a luminescent object material and a hole trapping material, and the second sub luminescent layer is composed of the luminescent host material and the luminescent object material;
wherein a hole mobility of the hole trapping material is larger than a hole mobility of the luminescent host material.

2. The organic electroluminescent device according to claim 1, wherein a lowest unoccupied molecular orbital of the hole trapping material is higher than a lowest unoccupied molecular orbital of the luminescent host material and lower than a lowest unoccupied molecular orbital of the electron blocking layer.

3. The organic electroluminescent device according to claim 2, wherein a difference between the lowest unoccupied molecular orbital of the hole trapping material and the lowest unoccupied molecular orbital of the luminescent host material is larger than 0 eV, and a difference between the lowest unoccupied molecular orbital of the electron blocking layer and the lowest unoccupied molecular orbital of the luminescent host material is larger than 0.1 eV.

4. The organic electroluminescent device according to claim 1, wherein a highest occupied molecular orbital of the hole trapping material is higher than a highest occupied molecular orbital of the luminescent host material and lower than a highest occupied molecular orbital of the luminescent object material.

5. The organic electroluminescent device according to claim 4, a difference between the highest occupied molecular orbital of the hole trapping material and the highest occupied molecular orbital of the luminescent host material is larger than 0 eV, and a difference between the highest occupied molecular orbital of the luminescent object material and the highest occupied molecular orbital of the luminescent host material is larger than 0 eV and smaller than 0.2 eV.

6. The organic electroluminescent device according to claim 1, wherein a thickness of the first sub luminescent layer is smaller than ½ of or equal to ½ of a thickness of the organic electroluminescent layer.

7. The organic electroluminescent device according to claim 6, wherein the thickness of the first sub luminescent layer is 5 nm to 20 nm.

8. The organic electroluminescent device according to claim 1, wherein in the first sub luminescent layer, a mass ratio of the hole trapping material to the luminescent host material is 3:7 to 7:3.

9. The organic electroluminescent device according to claim 1, wherein the hole trapping material is selected from one or any combination of AND, ADNP, An-1 or An-2:

10. The organic electroluminescent device according to claim 1, wherein the luminescent host material is selected from one or any combination of 4,4'-bis(2,2-distyryl)-1,1'-biphenyl, 4,4',4''-tris(carbazol-9-yl) triphenylamine, N,N'-dimethylquinacridone, or 3-methyltriphenylamine.

11. The organic electroluminescent device according to claim 1, wherein the luminescent object material is selected from one of 4,4'-bis(9-ethyl-3-carbazole vinyl)-1,1'-biphenyl and/or an amino-substituted distyryl aryl material.

12. The organic electroluminescent device according to claim 1, wherein a material of the electron blocking layer is selected from 4,4-bis(9-carbazole) biphenyl and/or 9,9'-biphenyl-6-(9-phenyl-9h-carbazol-3-yl)-9h,9'h-3,3'-bicarbazole.

13. The organic electroluminescent device according to claim 1, wherein in the first sub luminescent layer and the second sub luminescent layer, a mass ratio of the luminescent host material to the luminescent object material is 100:1 to 100:10.

14. The organic electroluminescent device according to claim 1, wherein the organic electroluminescent layer is a blue luminescent layer.

15. A display panel, comprising: a plurality of pixel units, wherein at least part of the pixel units comprise the organic electroluminescent device according to claim 1.

16. A display apparatus, comprising: the display panel according to claim 15.

17. A method for manufacturing an organic electroluminescent device, comprising:
   providing a base substrate with an anode;
   forming, by adopting a multi-source co-evaporation, a first sub luminescent layer composed of a hole trapping material, a luminescent host material and a luminescent object material on the anode; and forming a second sub luminescent layer composed of the luminescent host material and the luminescent object material on the first sub luminescent layer, wherein the first sub luminescent layer and the second sub luminescent layer constitute an organic electroluminescent layer, and a hole mobility of the hole trapping material is larger than a hole mobility of the luminescent host material; and
   forming a cathode on the second sub luminescent layer.

* * * * *